US012607678B2

(12) United States Patent (10) Patent No.: US 12,607,678 B2

Tominaga et al. (45) Date of Patent: Apr. 21, 2026

(54) OUTPUT CONTROL DEVICE, OUTPUT CONTROL METHOD, AND STORAGE MEDIUM

(71) Applicant: HONDA MOTOR CO., LTD., Tokyo (JP)

(72) Inventors: Yuki Tominaga, Wako (JP); Yurika Nishimoto, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 653 days.

(21) Appl. No.: 18/118,166

(22) Filed: Mar. 7, 2023

(65) Prior Publication Data

US 2023/0314518 A1 Oct. 5, 2023

(30) Foreign Application Priority Data

Mar. 30, 2022 (JP) ................................. 2022-055949

(51) Int. Cl.
| | |
|---|---|
| *H02J 7/00* | (2006.01) |
| *G01R 31/36* | (2020.01) |

(Continued)

(52) U.S. Cl.
CPC ....... *G01R 31/367* (2019.01); *G01R 31/3648* (2013.01); *G01R 31/385* (2019.01); *H02J 7/94* (2026.01); *H02J 7/96* (2026.01)

(58) Field of Classification Search
CPC .............. G01R 31/367; G01R 31/385; G01R 31/3648; H02J 7/007182; H02J 7/00714

(Continued)

(56) References Cited

U.S. PATENT DOCUMENTS

| | | | |
|---|---|---|---|
| 6,262,577 B1 | 7/2001 | Nakao et al. | |
| 11,437,836 B2 * | 9/2022 | Maruno | ................ H02J 7/0068 |

(Continued)

FOREIGN PATENT DOCUMENTS

| | | |
|---|---|---|
| CN | 1815798 | 8/2006 |
| CN | 105190985 | 12/2015 |

(Continued)

OTHER PUBLICATIONS

Japanese Office Action for Japanese Patent Application No. 2022-055949 mailed Nov. 21, 2023.

(Continued)

*Primary Examiner* — Alexis B Pacheco

(74) *Attorney, Agent, or Firm* — Amin, Turocy & Watson, LLP

(57) ABSTRACT

An output control device of a lithium ion battery includes an output control unit that controls an output of the lithium ion battery, and a computation unit that transmits a command to the output control unit, the computation unit calculates a distribution of a current and/or a potential within the electrode thickness of the negative electrode of the lithium ion battery by using a heterogeneous reaction model in the thickness direction of the electrode, and compares the distribution with a specified range in the negative electrode, and/or calculates a distribution of a current and/or a potential within the electrode thickness of the positive electrode of the lithium ion battery by using a heterogeneous reaction model in the thickness direction of the electrode, and compares the distribution with a specified range in the positive electrode, and transmits a command to the output control unit on the basis of a result of the comparison, and the output control unit controls an output voltage and/or an output current of the lithium ion battery on the basis of the command.

9 Claims, 4 Drawing Sheets

(51) Int. Cl.
| | |
|---|---|
| *G01R 31/367* | (2019.01) |
| *G01R 31/385* | (2019.01) |
| *H02J 7/14* | (2006.01) |
| *H02J 7/94* | (2026.01) |
| *H02J 7/96* | (2026.01) |

(58) Field of Classification Search
USPC ......................................................... 320/109
See application file for complete search history.

(56) References Cited

U.S. PATENT DOCUMENTS

| | | | |
|---|---|---|---|
| 2016/0162849 A1* | 6/2016 | Matsuyama | B60L 53/80 |
| | | | 705/305 |
| 2017/0131364 A1* | 5/2017 | Hosaka | G01R 31/36 |
| 2018/0222343 A1* | 8/2018 | Uchida | G06Q 30/0631 |
| 2018/0301770 A1* | 10/2018 | Nakaya | G01R 31/392 |
| 2019/0198941 A1 | 6/2019 | Oniki et al. | |
| 2020/0099235 A1 | 3/2020 | Ito et al. | |
| 2020/0326382 A1* | 10/2020 | Matsumura | G01R 31/371 |
| 2020/0384889 A1* | 12/2020 | Nishigaki | B60L 58/18 |
| 2022/0188481 A1 | 6/2022 | Okabe et al. | |

FOREIGN PATENT DOCUMENTS

| | | |
|---|---|---|
| CN | 109962308 | 7/2019 |
| CN | 110957544 | 4/2020 |
| CN | 111740457 | 10/2020 |
| JP | 2000-100479 | 4/2000 |
| JP | 2003-346919 | 12/2003 |
| JP | 2008-059910 | 3/2008 |
| JP | 2014-032825 | 2/2014 |
| JP | 2014-041805 | 3/2014 |
| JP | 2019-212392 | 12/2019 |
| JP | 2020-167155 | 10/2020 |
| JP | 2021-125423 | 8/2021 |

OTHER PUBLICATIONS

Chinese Office Action for Chinese Patent Application No. 202310117547.9 mailed Nov. 28, 2025.

\* cited by examiner

OUTPUT CONTROL DEVICE, OUTPUT CONTROL METHOD, AND STORAGE MEDIUM

CROSS-REFERENCE TO RELATED APPLICATION

The application is on the basis of Japanese Patent Application No. 2022-055949 filed on Mar. 30, 2022, the content of which is incorporated herein by reference.

BACKGROUND OF THE INVENTION

Field of the Invention

The present invention relates to an output control device, an output control method, and a storage medium.

Description of Related Art

In recent years, from the viewpoint of climate-related disasters, interest in electric vehicles has increased to reduce $CO_2$ emissions, and the use of lithium ion batteries for on-vehicle application has also been considered. Lithium ion batteries are lightweight and have high energy density, and thus are suitable as on-vehicle high-output power supplies.

A carbon material such as graphite is generally used as a negative electrode active material for a lithium ion battery, and the potential thereof changes when lithium ions enter between layers in a carbon material during charging. However, depending on charging and discharging conditions of the lithium ion battery, metallic lithium may be deposited on the negative electrode active material (lithium electrodeposition). It is known that the capacity of a lithium ion battery deteriorates when such lithium electrodeposition occurs. Here, the lithium electrodeposition means that lithium ions are electrically reduced and deposited as a lithium metal on the surface of a negative electrode.

In addition, as a positive electrode active material for a lithium ion battery, a ternary positive electrode material (NMC) such as $Li(Ni—Co—Mn)O_2$, and the like are used. In a case where a ternary positive electrode material is used as the positive electrode active material for a layered rock salt type positive electrode, and when a charging rate is increased by charging, that is, when more Li in molecules is extracted, a rock salt structure is destroyed and an irreversible reaction occurs, and it is known that the capacity of a lithium ion battery deteriorates due to a decrease in number of Li sites that can be used for charging and discharging in a positive electrode.

As a lithium ion battery deteriorates, the amount of charging and a regenerative output decrease as compared to when it was new, which results in a problem that the mileage of an electric vehicle is decreased.

Japanese Unexamined Patent Application, First Publication No. 2008-059910 discloses a control system for a lithium ion battery configured to be able to transmit and receive electric power to and from a load, in which the lithium ion battery includes first and second electrodes configured to contain an active material in which lithium exists in a solid phase, and an ionic conductor provided between the first and second electrodes for conducting the ionized lithium between the electrodes, the control system includes a battery state estimation unit for sequentially calculating a state estimation value indicating a battery state in accordance with a battery model capable of dynamically estimating an internal state of the lithium ion battery, on the basis of values detected by a sensor provided in the lithium ion battery, a battery information generation unit for generating battery information for limiting charging and discharging of the lithium ion battery on the basis of the state estimation value calculated by the battery state estimation unit, and a load control unit for generating an operation command for the load so as to avoid overcharging and overdischarging of the lithium ion battery in consideration of the battery information generated by the limit information generation unit on the basis of an operation request for the load, and the battery state estimation unit including a first model unit for inferring an electrochemical reaction of the lithium at an interface between the active material and the ion conductor in each of the electrodes, a second model unit for estimating a concentration distribution of the lithium in each of the electrodes on the basis of a diffusion equation, a third model unit for estimating an ion concentration distribution of the lithium in the ion conductor on the basis of a diffusion equation, a fourth model unit for estimating a potential distribution according to a current distribution generated in each of the electrodes and the ion conductor by a reaction current caused by the electrochemical reaction, and a boundary condition setting unit for setting a boundary condition at the interface of the diffusion equation used in the second model unit on the basis of a predetermined relational expression between a time derivative of the lithium concentration and the reaction current.

Japanese Unexamined Patent Application, First Publication No. 2003-346919 discloses a power storage system including a power storage device to which one or a plurality of lithium ion batteries are connected, a current value measurement unit measuring a current value flowing into the power storage device, a voltage value measurement unit measuring an output voltage value of the power storage device, a remaining capacity computation unit computing a remaining capacity of the power storage device on the basis of an integrated value of current values measured by the current value measurement unit or a voltage value measured by the voltage value measurement unit, an internal resistance computation unit computing an internal resistance of the power storage device on the basis of the remaining capacity computed by the remaining capacity computation unit, an open-circuit voltage computation unit computing an open-circuit voltage of the power storage device, and a main computation unit computing a dischargeable power, a chargeable power, a dischargeable capacity, and a chargeable capacity of the power storage device on the basis of the internal resistance computed by the internal resistance computation unit and the open-circuit voltage computed by the open-circuit voltage computation unit, the open-circuit voltage computation unit further including an ion concentration distribution computation unit calculating an ion concentration distribution in an active material for forming the lithium ion battery by using a diffusion equation on the basis of the current value measured by the current value measurement unit, and computing an open-circuit voltage of the power storage device from the ion concentration distribution in the active material calculated by the ion concentration distribution computation unit.

Japanese Unexamined Patent Application, First Publication No. 2014-041805 discloses a battery analysis method for analyzing a charging and discharging behavior of a lithium ion secondary battery in which a conductive aid is added to at least one active material of a positive electrode and a negative electrode, the battery analysis method including operating a current density distribution computation unit and an active material internal potential distribution computation unit to cause an electrode reaction with lithium ions by obtaining electron conduction even for isolated active material particles, the current density distribution computation unit calculating a current density distribution by receiving inputs of battery analysis shape data regarding dimensions and a shape of a battery to be analyzed, physical data based on the following assumption of a material which is used, and usage condition data regarding current values and times of charging and discharging by an input unit and reading the data by a reading unit on the assumption that an electrolyte existing between active material particles of a pole containing a conductive aid has a path through which electrons are able to be conducted by the conductive aid, and that electron conduction is also obtained in isolated active material particles of the pole, and the active material internal potential distribution computation unit calculating a potential distribution in an active material.

In the related art, in order to prevent lithium electrodeposition in a negative electrode of a lithium ion battery and destruction of a molecular structure of a positive electrode active material in a positive electrode, current and voltage limits are set in advance in the output control of a lithium ion battery, and the output control is performed within the range of the limits. The limits have a margin up to current and voltage limits at which lithium electrodeposition in a negative electrode and destruction of a molecular structure of a positive electrode active material in a positive electrode cannot be prevented. For this reason, it is difficult to say that a lithium ion secondary battery can fully exhibit its performance.

SUMMARY OF THE INVENTION

In recent years, it has been found that a heterogeneous reaction due to a difference between an electron conductivity and an ionic conductivity inside a battery (electron conductivity>>ionic conductivity) is the cause of lithium electrodeposition at a negative electrode, and a heterogeneous reaction due to a difference in a charge rate (state of charge: SOC) in a positive electrode is the cause of destruction of a molecular structure of a positive electrode active material. However, suitable real-time control for preventing heterogeneous reactions of negative and positive electrodes has not been achieved.

An aspect of the present invention has been made in consideration of such circumstances, and an object thereof is to provide an output control device, an output control method, and a storage medium which are capable of using lithium ion battery more safely by reducing the risk of lithium electrodeposition in a negative electrode and structural destruction of an active material in a positive electrode.

In order to solve the above problems and achieve the object, the present invention adopts the following aspects.

(1) An output control device according to an aspect of the present invention includes an output control unit that controls an output of the lithium ion battery, a voltage measurement unit that measures a discharge voltage of the lithium ion battery, a current measurement unit that measures a discharge current of the lithium ion battery, and a computation unit that transmits a command to the output control unit, in which the computation unit calculates a distribution of a current and/or a potential within the electrode thickness of the negative electrode of the lithium ion battery by using a heterogeneous reaction model in the thickness direction of the electrode, and compares the distribution with a preset upper limit current and/or lower limit potential in the negative electrode, and/or calculates a distribution of a current and/or a potential within the electrode thickness of the positive electrode of the lithium ion battery by using a heterogeneous reaction model in the thickness direction of the electrode, and compares the distribution with a preset upper limit current and/or upper limit potential in the positive electrode, and transmits a command to the output control unit on the basis of a result of the comparison, and the output control unit controls an output voltage and/or an output current of the lithium ion battery on the basis of the command.

(2) In the aspect (1) described above, the output voltage and/or the output current of the lithium ion battery may be controlled with the elapse of time.

(3) In the aspect of (1) or (2) described above, the computation unit may perform coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

(4) In an output control method according to an aspect of the present invention, a computer calculates a distribution of a current and/or a potential within an electrode thickness of a negative electrode of the lithium ion battery by using a heterogeneous reaction model in a thickness direction of the electrode, and compares the distribution with a preset upper limit current and/or lower limit potential in the negative electrode, and/or calculates a distribution of a current and/or a potential within an electrode thickness of a positive electrode of the lithium ion battery by using a heterogeneous reaction model in a thickness direction of the electrode, and compares the distribution with a preset upper limit current and/or upper limit potential in the positive electrode, and controls an output voltage and/or an output current of the lithium ion battery on the basis of a result of the comparison.

(5) In the aspect of (4) described above, the computer may control the output voltage and/or the output current of the lithium ion battery with the elapse of time.

(6) In the aspect of (4) or (5) described above, the computer may perform coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

(7) A storage medium according to an aspect of the present invention stores a program causing a computer to calculate a distribution of a current and/or a potential within an electrode thickness of a negative electrode of the lithium ion battery by using a heterogeneous reaction model in a thickness direction of the electrode, and compare the distribution with a preset upper limit current and/or lower limit potential, and/or calculate a distribution of a current and/or a potential within an electrode thickness of a positive electrode of the lithium ion battery by using a heterogeneous reaction model in a thickness direction of the electrode, and compare the distribution with a preset upper limit current and/or upper limit potential, and control an output voltage and/or an output current of the lithium ion battery on the basis of a result of the comparison.

(8) In the aspect of (7) described above, the computer may control the output voltage and/or the output current of the lithium ion battery with the elapse of time.

(9) In the aspect of (7) or (8) described above, the computer may perform coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

According to the aspects (1) to (9), it is possible to use a lithium ion battery more safely by reducing the risk of lithium electrodeposition.

DETAILED DESCRIPTION OF THE INVENTION

Hereinafter, an embodiment of an output control device, an output control method, and a storage medium according to the present invention will be described with reference to the drawings.

<Configuration of Output Control Device>

Figure 1:
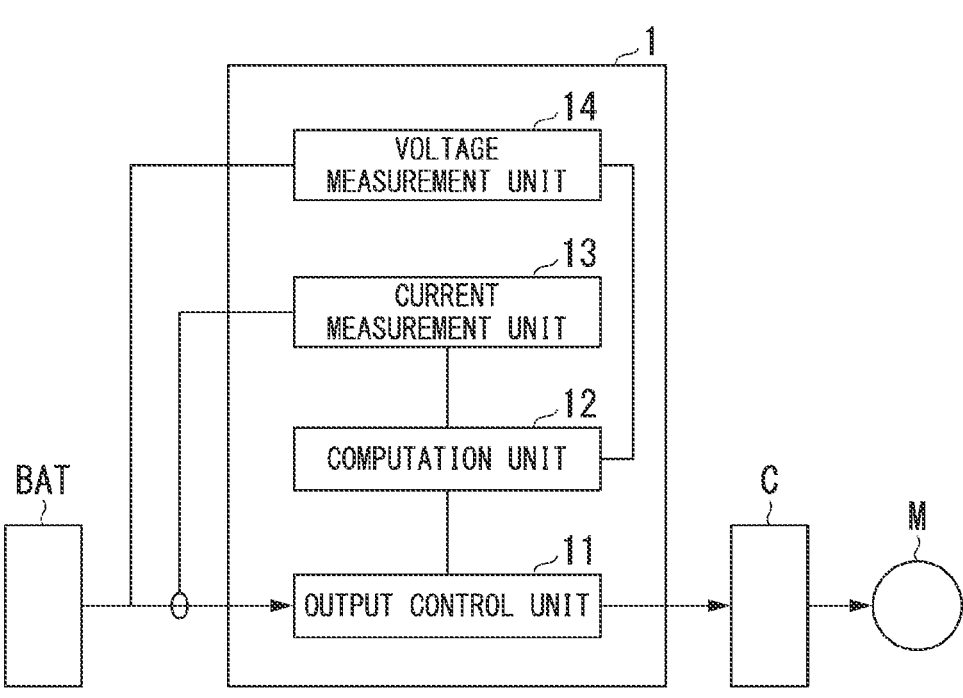
FIG. 1 is a block diagram illustrating a main configuration of an output control device of a lithium ion battery according to an embodiment of the present invention.

FIG. 1 is a block diagram illustrating a main configuration of an output control device according to an embodiment of the present invention. As illustrated in FIG. 1, an output control device 1 of the present embodiment includes an output control unit 11, a computation unit 12, a current measurement unit 13, and a voltage measurement unit 14. In the example of FIG. 1, a lithium ion battery BAT and a main control device C are connected to the output control device 1, and a main motor M is connected to the main control device C. Such an output control device 1 controls power from the lithium ion battery BAT to be a current and/or a potential in a range in which the lithium ion battery BAT does not cause lithium electrodeposition in a negative electrode and/or structural destruction of an active material in a positive electrode and supplies the current to the main control device C.

The output control unit 11 receives a command from the computation unit 12 and controls an output current and an output voltage of the lithium ion battery BAT. Specifically, the output control unit 11 performs control for decreasing the output voltage and the output current of the lithium ion battery BAT, or performs control for maintaining the current state without decreasing the output voltage and the output current.

The computation unit 12 includes a built-in processor, memory, and storage, receives data from the current measurement unit 13 and the voltage measurement unit 14, and stores the data in a storage. The processor of the computation unit 12 calculates a distribution of a current and/or a potential within an electrode thickness of a negative electrode of the lithium ion battery by using a heterogeneous reaction model in the thickness direction of the electrode to compare with a preset lower limit potential and/or upper limit current in the negative electrode, and/or calculates a distribution of a current and/or a potential within an electrode thickness of a positive electrode of the lithium ion battery by using a heterogeneous reaction model in the thickness direction of the electrode to compare with a preset upper limit potential and/or upper limit current in the positive electrode. Here, the values of the preset lower limit potential and upper limit current in the negative electrode may be limit values at which lithium electrodeposition occurs at an interface between the electrode and electrolyte. In addition, the values of the preset upper limit potential and upper limit current in the positive electrode may be limit values at which irreversible structural destruction occurs in a positive electrode active material. As a result of the comparison, when a current and/or a potential within the electrode thickness deviates from a preset range, a command for lowering an output voltage and an output current of the lithium ion battery BAT (output suppression control) is transmitted to the output control unit 11, and when the current and/or the potential does not deviate from the preset range, a command for maintaining the current state (normal control) without lowering the output voltage and the output current of the lithium ion battery BAT is transmitted to the output control unit 11. It is preferable that the control of the output voltage and/or the output current of the lithium ion battery BAT be performed with the elapse of time.

It is preferable that the computation unit 12 be configured to calculate a distribution of a current and/or a potential within the electrode thickness of the lithium ion battery BAT by performing coupled analysis of a diffusion equation in which a relationship between the consumption and supply of lithium ions in an electrode internal liquid of the lithium ion battery BAT is modeled, and an equivalent circuit in which a relationship between the movement of electrons in the electrode and a potential is modeled.

The current measurement unit 13 measures a current supplied from the lithium ion battery BAT to the output control unit 11 of the output control device 1. The voltage measurement unit 14 measures the voltage of the lithium ion battery BAT. As the current measurement unit 13 and voltage measurement unit 14, for example, a clamp meter or the like that measures a current and a voltage in a non-contact manner can be used.

The main control device C is, for example, a VVVF inverter control device, and the main motor M is, for example, a squirrel-cage three-phase induction motor.

Among the components of the output control device 1 described above, the output control unit 11 and the computation unit 12 are implemented by a hardware processor such as a central processing unit (CPU) executing a program (software). Some or all of these components may be implemented by hardware (circuit unit; circuitry) such as a large scale integration (LSI), an application specific integrated circuit (ASIC), a field-programmable gate array (FPGA), or a graphics processing unit (GPU), or may be implemented by software and hardware in cooperation. The program may be stored in advance in a storage device (a storage device including a non-transitory storage medium) such as a hard disk drive (HDD) or a flash memory, may be stored in a detachable storage medium (non-transitory storage medium) such as a DVD or a CD-ROM, or may be installed by mounting a storage medium on a drive device.

The output control device 1 described above can be mounted, for example, on a mobile object that runs by an electric motor. A lithium ion battery BAT for supplying power for driving the electric motor is also mounted in such a mobile object. In addition, the output control device 1 mounted on the mobile object controls the output of the lithium ion battery BAT mounted on the mobile object. Note that the lithium ion battery BAT may be, for example, a cassette-type battery pack that is detachably attached to a mobile object.

Here, the mobile object may be, for example, a battery electric vehicle (BEV) that runs by the electric motor driven with power supplied from the lithium ion battery BAT. Alternatively, the mobile object may be a Plug-in Hybrid Vehicle (PHV) or a Plug-in Hybrid Electric Vehicle (PHEV) which is a hybrid vehicle equipped with an external charging function. Note that the mobile object is not limited to a four-wheeled vehicle and may be, for example, a saddle-type two-wheeled vehicle, a three-wheeled vehicle (including a vehicle with two front wheels and one rear wheel in addition to a vehicle with one front wheel and two rear wheels), an assist type bicycle, an electric boat, or the like.

<Operation of Output Control Device>

Figure 2:
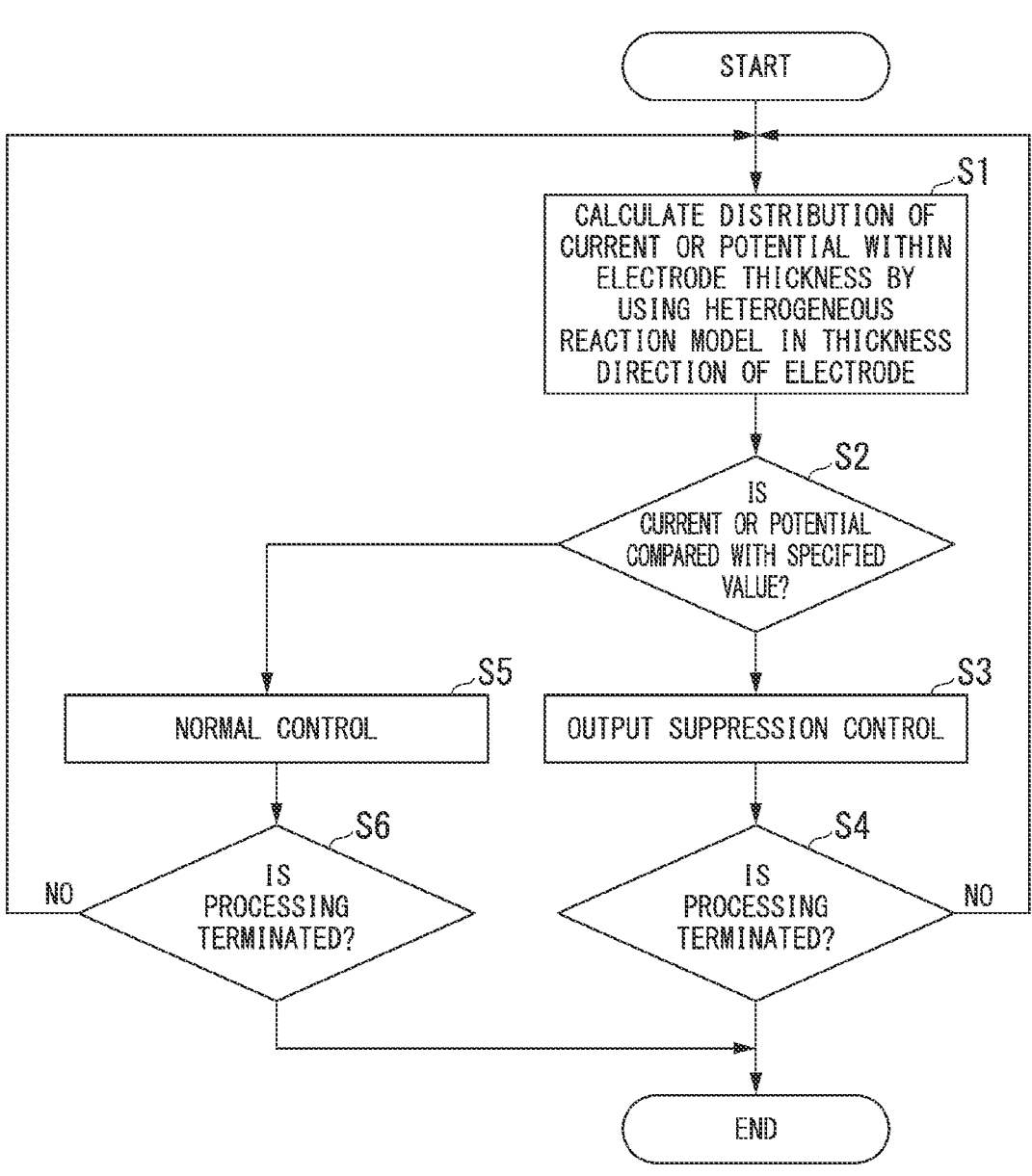
FIG. 2 is a flowchart illustrating an operation example of the output control device of the lithium ion battery according to the embodiment of the present invention.

FIG. 2 is a flowchart illustrating an operation example of the output control device according to the embodiment of the present invention. Processing of the flowchart illustrated in FIG. 2 is started, for example, when the output control device 1 is instructed to start discharging the lithium ion battery BAT.

When the processing of the flowchart illustrated in FIG. 2 is started, first, the computation unit 12 calculates a distribution of a current and/or a potential within an electrode thickness of a negative electrode and/or a positive electrode of a lithium ion battery by using a heterogeneous reaction model in the thickness direction of the electrode on the basis of data received from the current measurement unit 13 and the voltage measurement unit 14 (step S1). Next, the computation unit 12 compares a current and/or a potential within the electrode thickness of the negative electrode and/or the positive electrode with a preset current and/or potential (step S2). Next, when the current and/or potential within the electrode thickness deviates from a preset range, the computation unit 12 transmits a command for lowering an output current and/or an output voltage of the lithium ion battery BAT (output suppression control) to the output control unit 11, and when it does not deviate from the preset range, the computation unit 12 transmits a command for maintaining the current state (normal control) without lowering the output voltage and the output current of the lithium ion battery BAT to the output control unit 11 (step S3).

When the output control unit 11 receives the command for lowering the output current and/or the output voltage of the lithium ion battery BAT (output suppression control) transmitted by the computation unit 12, the output control unit 11 performs control so that the output current and/or the output voltage of the lithium ion battery BAT is lowered (step S3).

When the output control unit 11 receives the command for maintaining the current state (normal control) without lowering the output voltage and/or the output current of the lithium ion battery BAT transmitted by the computation unit 12, the output control unit 11 performs control so that the current state of the output current and/or voltage of the lithium ion battery BAT is maintained (step S4).

The control of the output voltage and/or the output current of the lithium ion battery BAT is performed with the elapse of time, and in order to prevent lithium electrodeposition in the negative electrode and/or structural destruction of an active material in the positive electrode, calculation of a current and/or a potential within the electrode thickness and control of the output voltage and output current of the lithium ion battery BAT in the output control unit 11 are performed in real time.

The calculation of the current and/or potential within the electrode thickness by the computation unit 12 is performed by performing coupled analysis of a diffusion equation in which a relationship between the consumption and supply of lithium ions in an electrode internal liquid is modeled, and an equivalent circuit in which a relationship between the movement of electrons in an electrode and a potential is modeled.

The processing of the flowchart illustrated in FIG. 2 is terminated, for example, when the output control device 1 is instructed to stop discharging the lithium ion battery BAT (steps S5 and S6).

Figure 3:
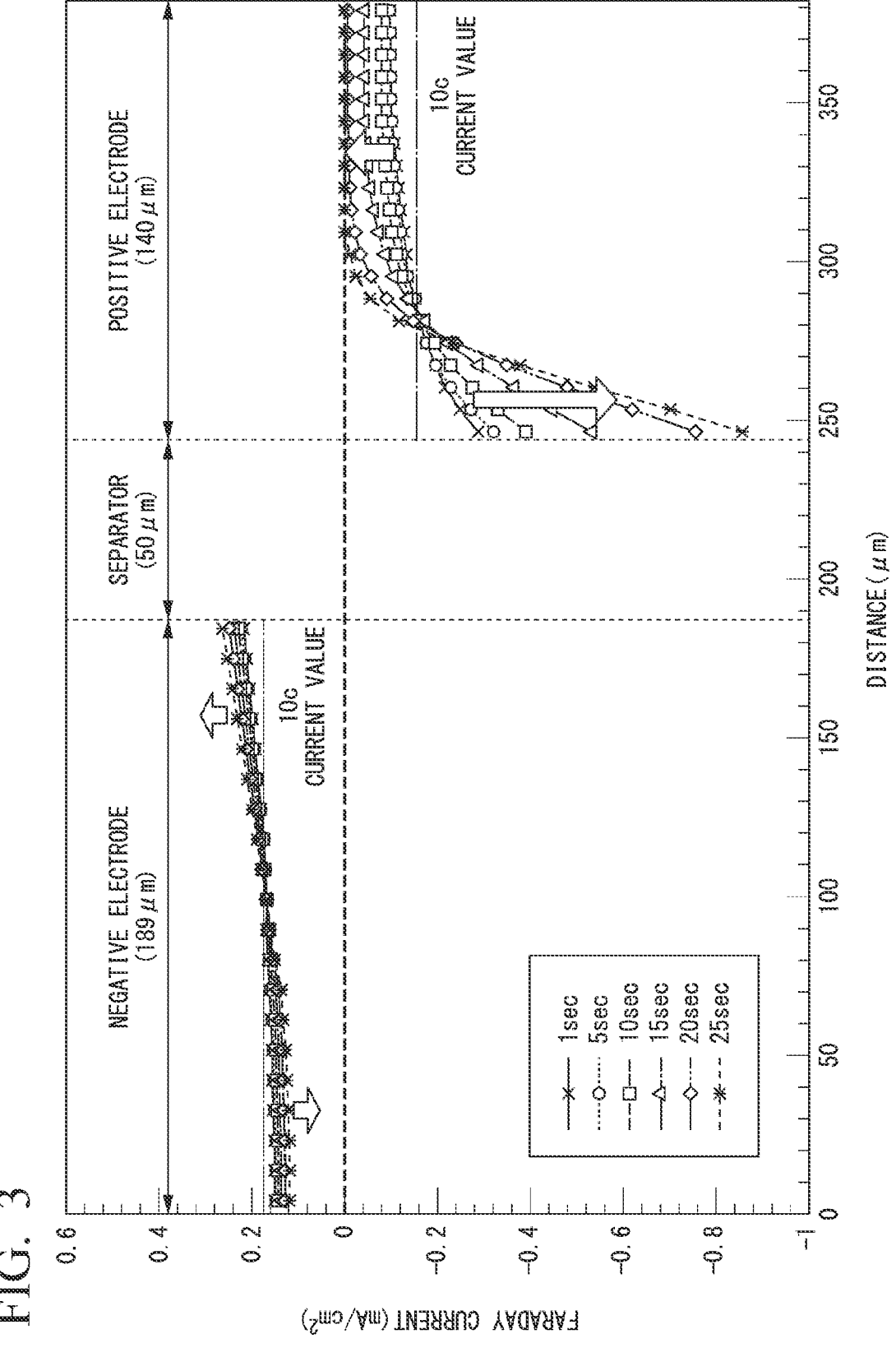
FIG. 3 is a graph illustrating current distributions in thickness directions of electrodes of the lithium ion battery (horizontal axis: distance, vertical axis: Faraday current).

FIG. 3 is a graph illustrating current distributions in the thickness directions of the electrodes of the lithium ion battery which are calculated by the computation unit of the output control device according to the embodiment of the present invention (horizontal axis: distance, vertical axis: Faraday current).

Figure 4:
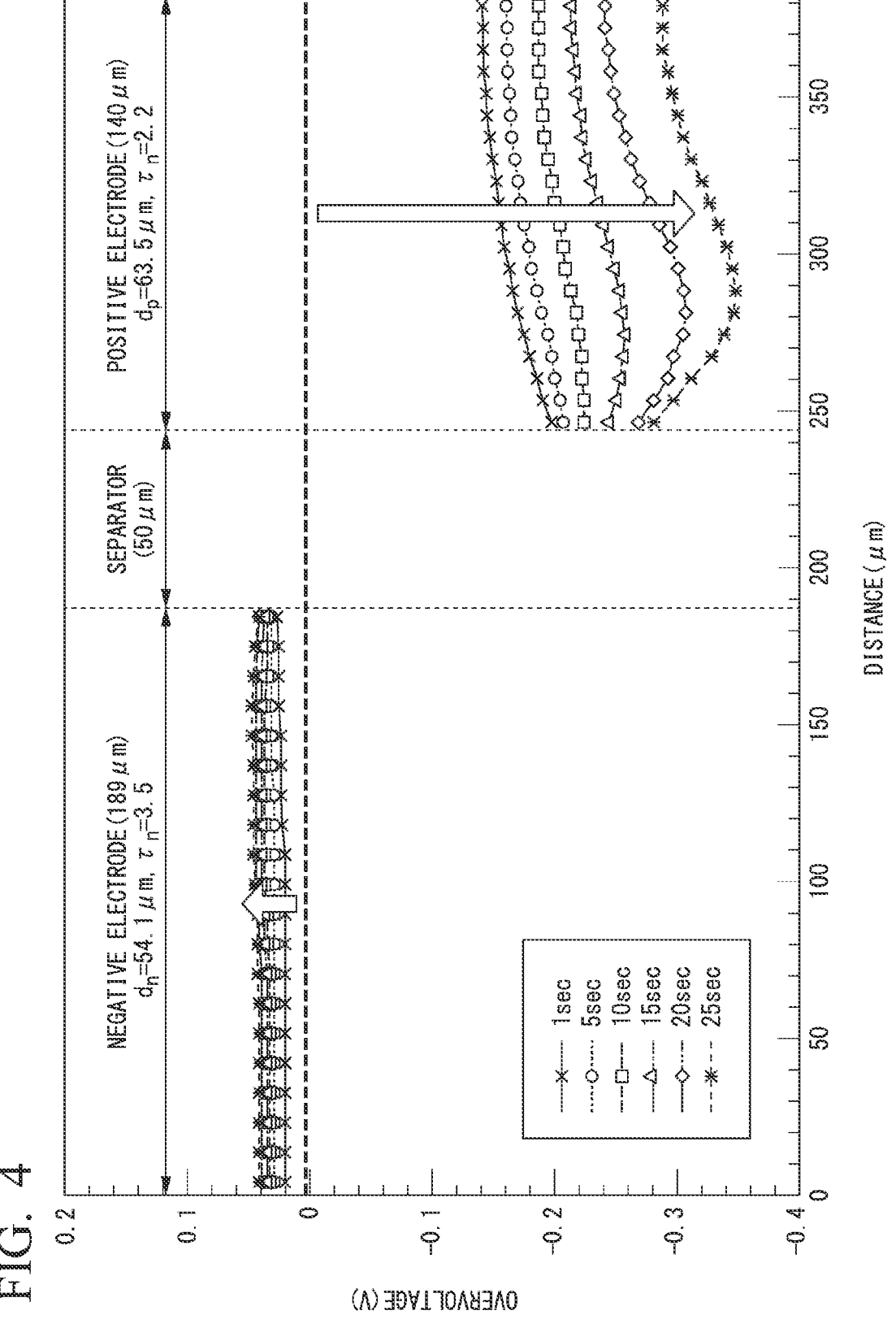
FIG. 4 is a graph illustrating potential distributions in thickness directions of electrodes of the lithium ion battery (horizontal axis: distance, vertical axis: overvoltage).

FIG. 4 is a graph illustrating current distributions in the thickness directions of the electrodes of the lithium ion battery which are calculated by the computation unit of the output control device according to the embodiment of the present invention (horizontal axis: distance, vertical axis: overvoltage).

With reference to FIGS. 3 and 4, it can be understood that a current and/or a potential within the electrode thickness tends to increase with the elapse of time as the lithium ion battery discharges.

As described above, according to the present embodiment, a distribution of a current and/or a potential within the electrode thickness of the lithium ion battery is calculated using a heterogeneous reaction model in the thickness direction of the electrode and is compared with a preset range, and an output voltage and an output current of the lithium ion battery are controlled based on a result of the comparison. In addition, the distribution of the current and/or potential within the electrode thickness of the lithium ion battery is calculated by performing coupled analysis of a diffusion equation in which a relationship between the consumption and supply of lithium ions in an electrode internal liquid, and an equivalent circuit in which a relationship between movement of electrons in the electrode and a potential is modeled. Thereby, it is possible to use the lithium ion battery more safely by reducing the risk of lithium electrodeposition in a negative electrode and/or structural destruction of an active material in a positive electrode.

In addition, according to the present embodiment, it is possible to sufficiently exhibit the performance of the lithium ion battery and reduce an energy loss, thereby contributing to the realization of a sustainable society.

The embodiment described above can be expressed as follows.

A device including:

a storage medium that stores computer-readable instructions; and a processor which is connected to the storage medium, wherein the processor executes the computer-readable instructions to calculate a distribution of a current and/or a potential in a negative electrode and/or a positive electrode within an electrode thickness of a lithium ion battery by using a heterogeneous reaction model in a thickness direction of the electrode, compare the distribution with a preset range of a voltage and/or a potential, and control an output voltage and/or an output current of the lithium ion battery on the basis of a result of the comparison.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An output control device of a lithium ion battery, the output control device comprising:

an output control unit that controls an output of the lithium ion battery;

a voltage measurement unit that measures a discharge voltage of the lithium ion battery;

a current measurement unit that measures a discharge current of the lithium ion battery; and a computation unit that transmits a command to the output control unit, wherein the computation unit calculates a distribution of a current and/or a potential within the electrode thickness of the negative electrode of the lithium ion battery by using a heterogeneous reaction model in the thickness direction of the electrode, and compares the distribution with a preset upper limit current and/or lower limit potential in the negative electrode, and/or calculates a distribution of a current and/or a potential within the electrode thickness of the positive electrode of the lithium ion battery by using a heterogeneous reaction model in the thickness direction of the electrode, and compares the distribution with a preset upper limit current and/or upper limit potential in the positive electrode, and transmits a command to the output control unit on the basis of a result of the comparison, and the output control unit controls an output voltage and/or an output current of the lithium ion battery on the basis of the command.

2. The output control device according to claim 1, wherein the output voltage and/or the output current of the lithium ion battery is controlled with the elapse of time.

3. The output control device according to claim 1, wherein the computation unit performs coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

4. An output control method for a lithium ion battery, the output control method comprising:

causing a computer to calculate a distribution of a current and/or a potential within an electrode thickness of a negative electrode of the lithium ion battery by using a heterogeneous reaction model in a thickness direction of the electrode, and compare the distribution with a preset upper limit current and/or lower limit potential in the negative electrode, and/or calculate a distribution of a current and/or a potential within an electrode thickness of a positive electrode of the lithium ion battery by using a heterogeneous reaction model in a thickness direction of the electrode, and compare the distribution with a preset upper limit current and/or upper limit potential in the positive electrode, and control an output voltage and/or an output current of the lithium ion battery on the basis of a result of the comparison.

5. The output control method according to claim 4, wherein the computer controls the output voltage and/or the output current of the lithium ion battery with the elapse of time.

6. The output control method according to claim 4, wherein the computer performs coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

7. A computer-readable non-transitory storage medium that stores a program causing a computer to calculate a distribution of a current and/or a potential within an electrode thickness of a negative electrode of the lithium ion battery by using a heterogeneous reaction model in a thickness direction of the electrode, and compare the distribution with a preset upper limit current and/or lower limit potential, and/or calculate a distribution of a current and/or a potential within an electrode thickness of a positive electrode of the lithium ion battery by using a heterogeneous reaction model in a thickness direction of the electrode, and compare the distribution with a preset upper limit current and/or upper limit potential, and control an output voltage and/or an output current of the lithium ion battery on the basis of a result of the comparison.

8. A computer-readable non-transitory storage medium storing the program according to claim 7 causing the computer to control the output voltage and/or the output current of the lithium ion battery with the elapse of time.

9. A computer-readable non-temporary storage medium storing the program according to claim 7 causing the computer to perform coupled analysis of a diffusion equation in which a relationship between consumption and supply of lithium ions in an electrode internal liquid is modeled, and an equivalent circuit in which a relationship between movement of electrons in the electrode and a potential is modeled to calculate the distribution of the current and/or the potential within the electrode thickness of the negative electrode of the lithium ion battery, and/or the distribution of the current and/or the potential within the electrode thickness of the positive electrode of the lithium ion battery.

\* \* \* \* \*